United States Patent
Denison

(10) Patent No.: US 8,004,051 B2
(45) Date of Patent: Aug. 23, 2011

(54) LATERAL TRENCH MOSFET HAVING A FIELD PLATE

(75) Inventor: Marie Denison, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 335 days.

(21) Appl. No.: 12/366,797

(22) Filed: Feb. 6, 2009

(65) Prior Publication Data

US 2010/0200915 A1 Aug. 12, 2010

(51) Int. Cl.
*H01L 29/66* (2006.01)
(52) U.S. Cl. ............ 257/409; 257/335; 257/E27.091; 257/E29.258; 257/E29.26
(58) Field of Classification Search .......... 257/335, 257/339, 409, 412, 492, 493, E21.585, E21.655, 257/E27.091, E29.256, E29.258, E29.26
See application file for complete search history.

(56) References Cited

U.S. PATENT DOCUMENTS

| | | | | |
|---|---|---|---|---|
| 5,701,026 A | * | 12/1997 | Fujishima et al. | 257/510 |
| 6,096,608 A | * | 8/2000 | Williams | 438/270 |
| 6,525,375 B1 | * | 2/2003 | Yamaguchi et al. | 257/341 |
| 6,806,533 B2 | * | 10/2004 | Henninger et al. | 257/328 |
| 6,867,456 B2 | * | 3/2005 | Sakakibara | 257/330 |
| 7,804,150 B2 | * | 9/2010 | Jeon et al. | 257/492 |
| 2008/0023787 A1 | * | 1/2008 | Shimada et al. | 257/506 |

OTHER PUBLICATIONS

"Folded Gate LDMOS with Low On-Resistance and High Transconductance", Shuming Xu, Yuanzheng Zhu, Pang-Dow Foo, Yung C. Liang and Johnny K.O. Sin, IEEE, 2000, pp. 55-58.

* cited by examiner

*Primary Examiner* — Matthew Landau
*Assistant Examiner* — Joseph C Nicely
(74) *Attorney, Agent, or Firm* — Warren L. Franz; Wade J. Brady, III; Frederick J. Telecky, Jr.

(57) ABSTRACT

One embodiment relates to an integrated circuit that includes a lateral trench MOSFET disposed in a semiconductor body. The lateral trench MOSFET includes source and drain regions having a body region therebetween. A gate electrode region is disposed in a trench that extends beneath the surface of the semiconductor body at least partially between the source and drain. A gate dielectric separates the gate electrode region from the semiconductor body. In addition, a field plate region in the trench is coupled to the gate electrode region, and a field plate dielectric separates the field plate region from the semiconductor body. Other integrated circuits and methods are also disclosed.

21 Claims, 19 Drawing Sheets

LATERAL TRENCH MOSFET HAVING A FIELD PLATE

FIELD

The disclosure herein relates generally to metal-oxide semiconductor field effect transistor (MOSFET), and more specifically to a lateral trench MOSFET having a field plate.

BACKGROUND

In some types of power transistor devices, a variable known as the specific on-resistance $R_{SP}$ is a meaningful figure of merit. In essence, $R_{SP}$ tells a designer how much area is needed for a device to realize a certain resistance. In mathematical terms, $R_{sp}=R_{dson}*area$. For example, if a device has an on-resistance of 100 mΩ and an area of 1 mm$^2$, it would have an $R_{SP}$ of 100 mΩ*mm$^2$. Thus, if a designer had a new circuit that needed an on-resistance of 200 mΩ, he could cut the area of the device in half (i.e., use a device with an area of 0.5 mm$^2$). Ideally, it is desirable to realize MOSFET transistors with $R_{SP}$ to be as small as possible.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

One embodiment relates to an integrated circuit that includes a lateral trench MOSFET disposed in a semiconductor body. The lateral trench MOSFET includes source and drain regions having a body region therebetween. A gate electrode region is disposed in a trench that extends beneath the surface of the semiconductor body at least partially between the source and drain. A gate dielectric separates the gate electrode region from the semiconductor body. In addition, a field plate region in the trench is coupled to the gate electrode region, and a field plate dielectric separates the field plate region from the semiconductor body. Other integrated circuits and methods are also disclosed.

The following description and annexed drawings set forth certain illustrative aspects. Other aspects, advantages and/or features may, however, become apparent from the following detailed description when considered in conjunction with the annexed drawings.

DETAILED DESCRIPTION OF THE INVENTION

Figure 1:
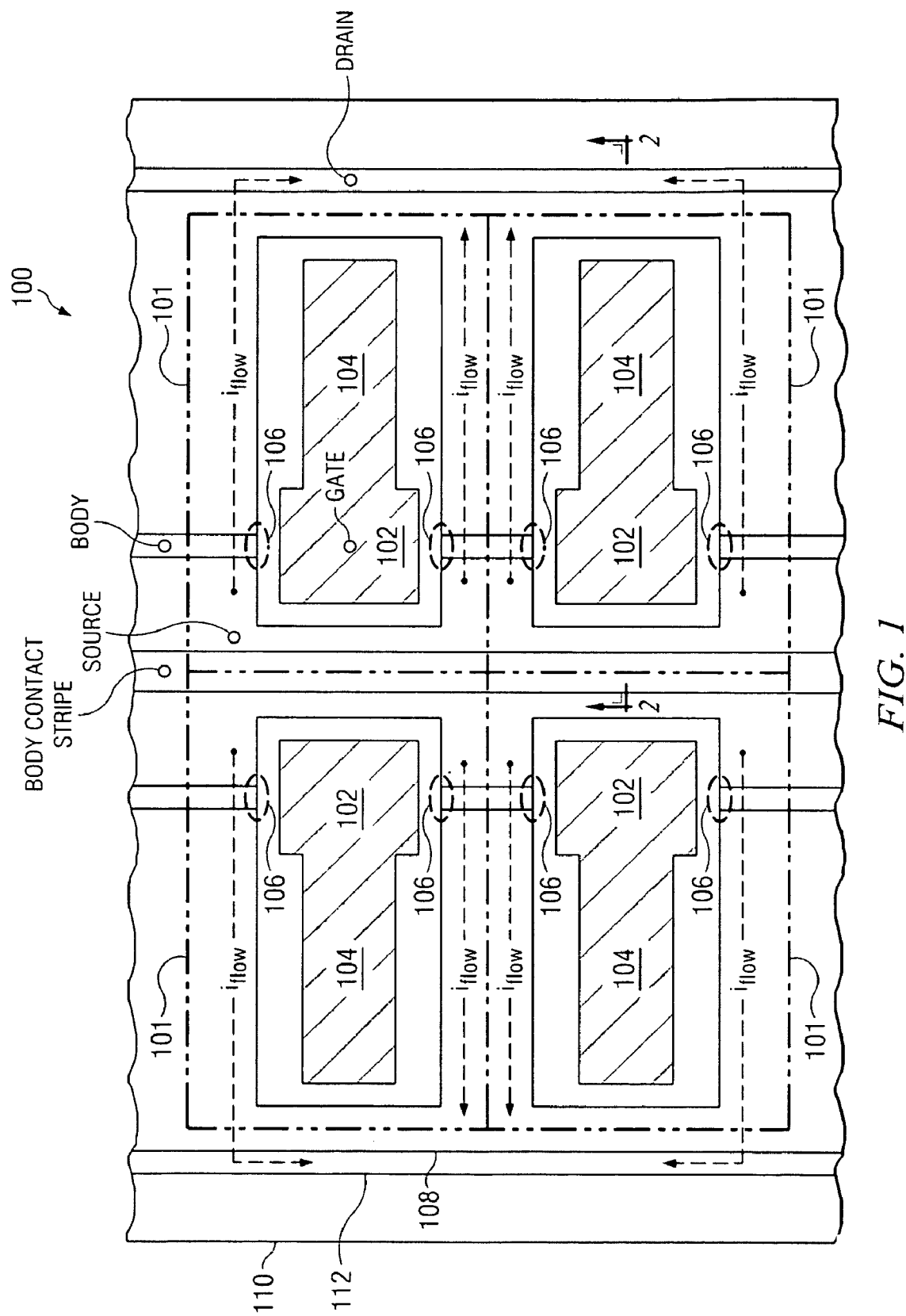
FIG. 1 shows a layout top view of one embodiment of a lateral trench MOSFET in which the accompanying discussion provides a functional description of the device.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding. In the examples of this disclosure, the semiconductor regions are doped using either dopant implantation or deposition of a doped material at the surface of the semiconductor material followed by diffusion into the semiconductor material. Patterned doped regions are assumed to be obtained by means of traditional lithographic techniques, for example, where lithography broadly refers to processes for transferring one or more patterns between various media.

As will be appreciated in more detail further herein, aspects of the present invention relate to a lateral trench metal-oxide semiconductor field effect transistor (MOSFET) that includes an electrode formed beneath the surface of a semiconductor body, where the electrode includes a gate electrode region that is laterally coupled to a field plate region. The field plate region increases carrier depletion in the drain extension (i.e., the active area between source and drain terminal) at high drain voltage, allowing the lateral trench MOSFET to sustain more voltage at a given source-drain pitch or to increase the drain extension doping for a given breakdown voltage, in both cases improving the $R_{sp}$-breakdown voltage trade-off.

Figure 2:
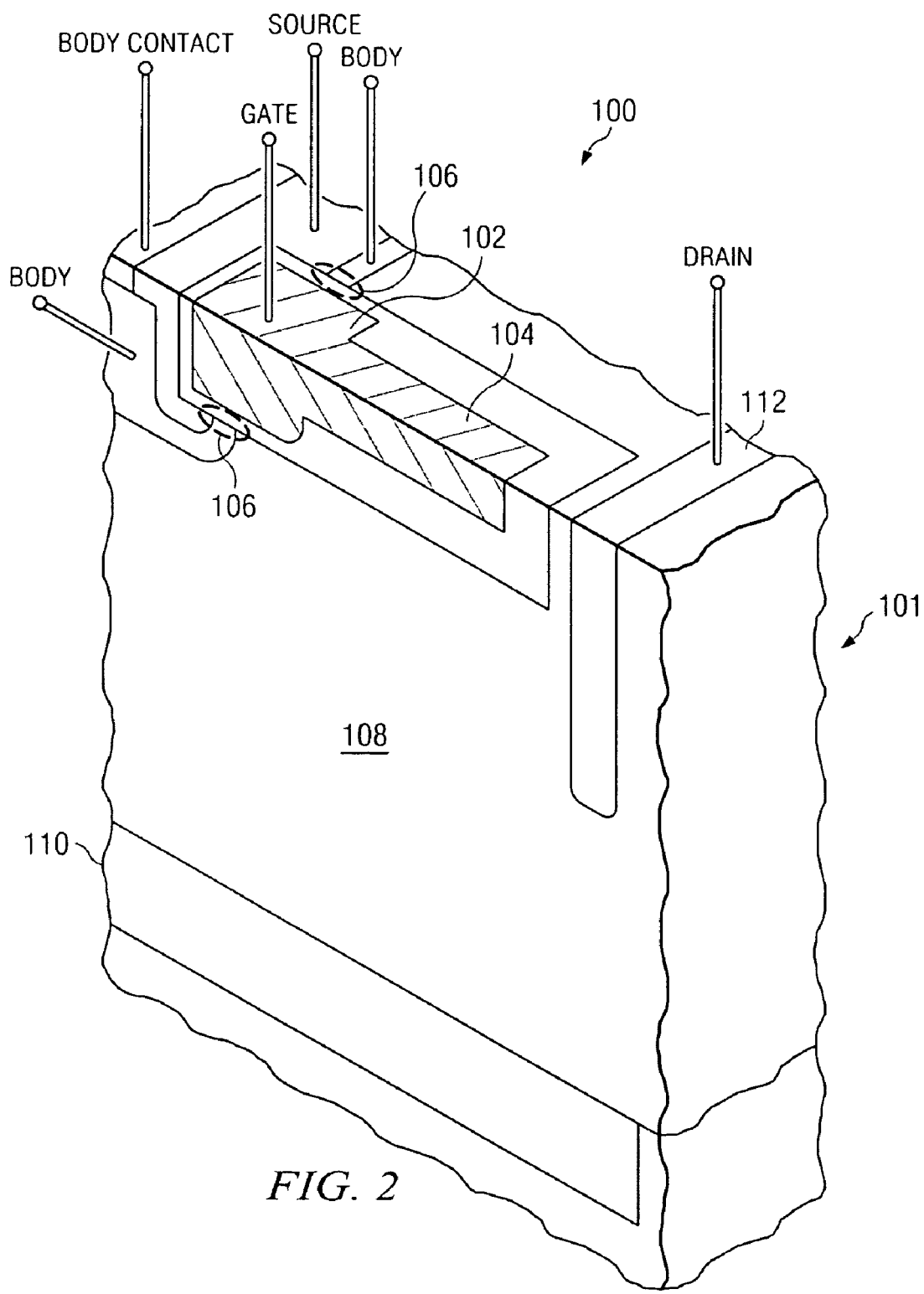
FIG. 2 shows a three-dimensional cut-away view of the lateral trench MOSFET of FIG. 1.

To understand how one example of the lateral trench MOSFET may function, reference is made to FIGS. 1-2. FIG. 1 shows a top-view of a lateral trench MOSFET 100 that includes four unit cells 101, and FIG. 2 shows a three-dimensional cut-away view of a single unit cell as indicated. Although the illustrated lateral trench MOSFET 100 includes four unit cells 101, other embodiments of a lateral trench MOSFET could have any number of unit cells (e.g., one unit cell up to a very large number of unit cells). Generally, as more unit cells are added to the lateral trench MOSFET, the amount of current that the device can source/drain will increase.

Like many transistors, the lateral trench MOSFET 100 may be thought of as including four terminals, namely a source terminal (SOURCE), a drain terminal (DRAIN), a gate terminal (GATE), and a body terminal (BODY), whereby BODY and SOURCE abut one another and can be electrically shorted together.

During device operation, a gate-source voltage ($V_{GS}$) can be selectively applied to the gate (and thus a gate electrode region 102 and a field plate region 104) relative to the source, thereby forming a conductive channel in channel regions 106. The channel regions 106 annularly surround the gate electrode region 102 in the body of each unit cell. While $V_{GS}$ is applied to form the conductive channel, a drain to source voltage ($V_{DS}$) is applied to create an electric field that "sweeps" the charged carriers between the source and drain. More specifically, in the illustrated embodiment, current could flow from the source terminal, through the channel region 106, past the field plate region 104 and up the drain terminal 112, as indicated by the $i_{flow}$ lines in FIG. 1. To facilitate this functionality, the drain may include a drain extension region that includes one or more features that work in conjunction with one another to capture the charged carriers and direct them up the drain. For example, the drain extension region may include a buried drain region 110 to better isolate the body from substrate by significantly reducing the gain of the parasitic PNP component between body, drain and substrate.

Notably, the field plate regions 104 improve the lateral electric field profile between source and drain. The field plates regions 104 serve to increase the source-drain breakdown voltage of the lateral trench MOSFET 100 or to reduce its $R_{sp}$. For example, in one embodiment the lateral trench MOSFET 100 can have an $R_{SP}$ of 30 mΩ*mm$^2$ with a breakdown voltage of approximately 80V. In other embodiments, a high density field oxide can be used for the for a field plate dielectric, which can increase $R_{sp}$ by an additional approximately 10-15% by providing mobility enhancement along the drain extension caused by the compressive stress generated by field oxidation (up to approximately 500 MPa).

Figure 3:
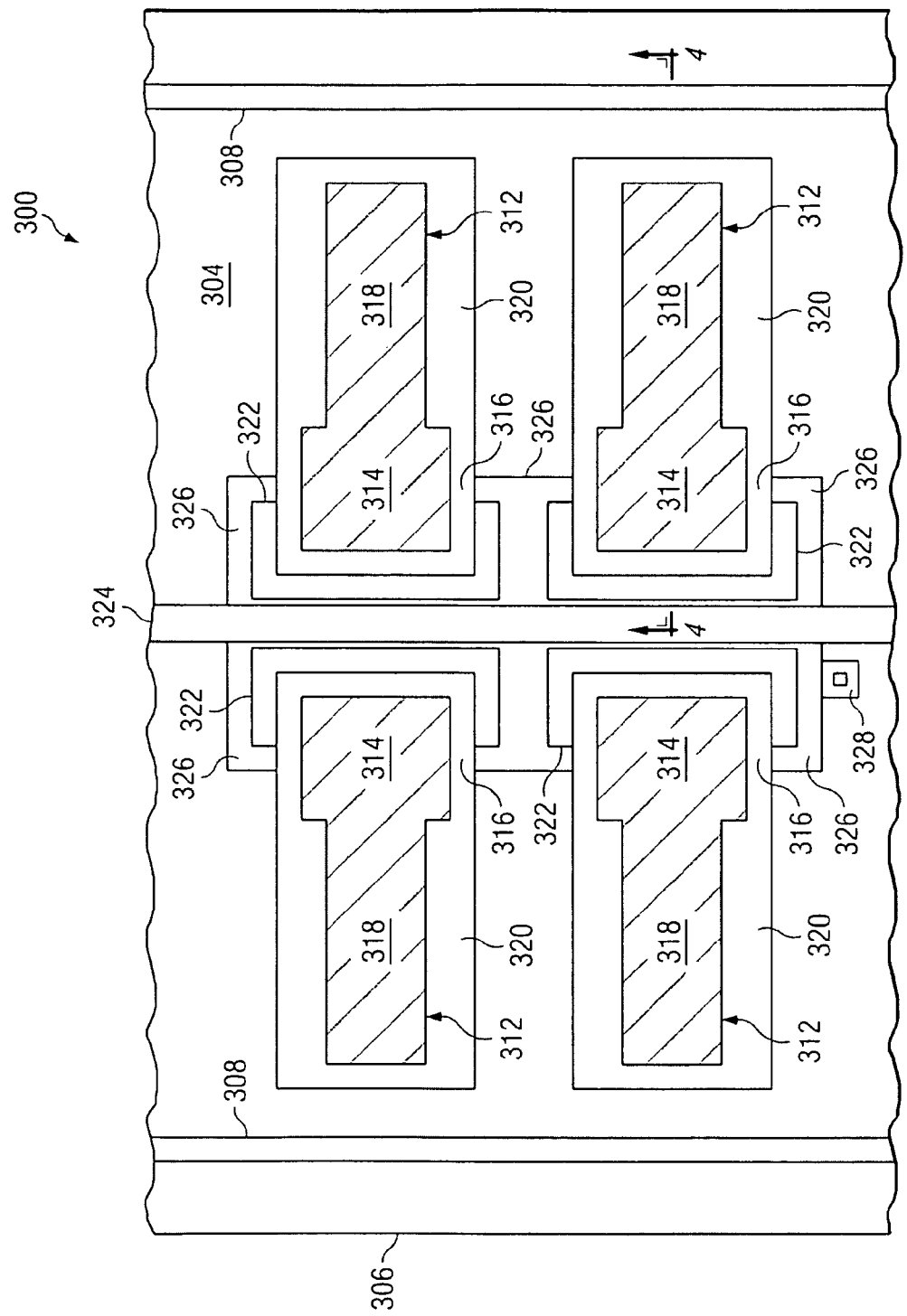
FIG. 3 shows a layout top view of one embodiment of a lateral trench MOSFET in which the accompanying discussion provides a structural description of the device.
Figure 4:
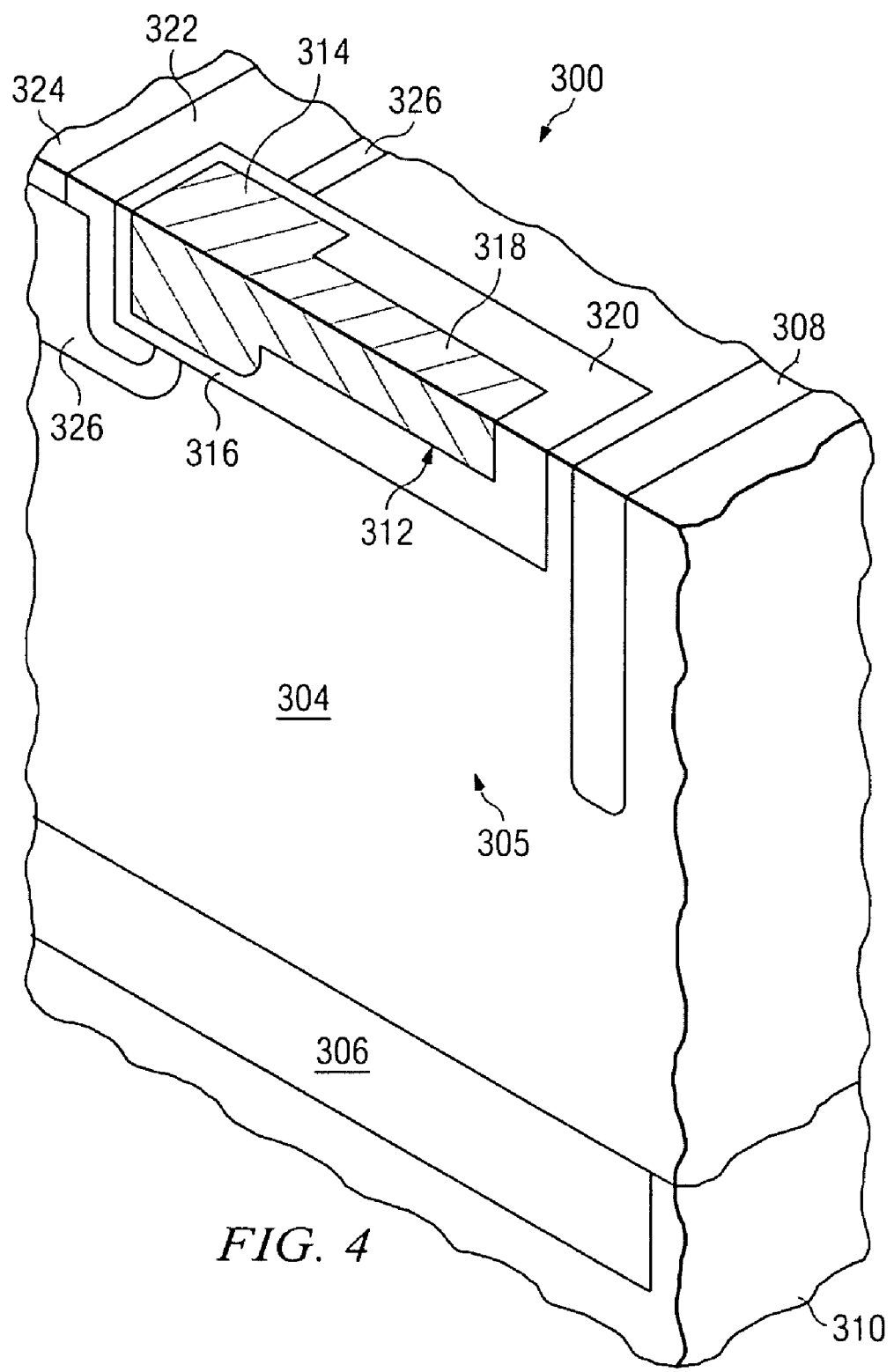
FIG. 4 shows a three-dimensional cut-away view of the lateral trench MOSFET of FIG. 3.

Now that a brief functional description has been set forth, a more detailed structural discussion of a lateral trench MOSFET 300 is provided with reference to FIGS. 3-4. For purposes of clarity, this discussion may use the terms drain, body, source, and gate; thereby highlighting some examples of structures that could achieve the aforementioned functionality. It will be appreciated, however, that other structures could also achieve the aforementioned functionality and all such other structures are also contemplated as failing within the scope of the present invention.

As shown, the previously discussed drain terminal may in general include a drain extension 305 that serves to collect current in an efficient manner. The illustrated drain extension 305 includes an epitaxial (EPI) layer 304, a buried drain region 306, and a deep well 308. In other embodiments, other features may be used in addition to or in place of these illustrated features.

The EPI layer 304 has a first conductivity type (e.g., n-type, such as N−) and is formed over a semiconductor substrate 310 having a second conductivity type (e.g., p type, such as P−). Alternatively, the EPI layer 304 can have a second conductivity type and be counter-doped to the first conductivity type (e.g., n-type, N−) by implantation. Also, the EPI region can be tailored by multiple layers or wells along the depth, length and width to optimize the device breakdown and $R_{sp}$. Typically, the dopant concentration of the EPI layer 304 is less than the dopant concentration of the buried drain region 306 as well as the dopant concentration of other subsequently formed regions having the first conductivity type. In addition, the EPI doping concentration is often higher in regions adjacent to the trench and is often lower in regions beneath the trench.

The buried drain region 306 also has the first conductivity type (e.g., n-type, such as N+), and is formed under the EPI layer 304 and above the semiconductor substrate 310. Thus, current can flow directly from the EPI layer 304 into the buried drain region 306.

The deep well 308 also has the first conductivity type (e.g., n-type, such as N) and is formed in the EPI layer 304. The deep well extends downwards from the surface of the EPI layer and may touch (but need not touch) the buried drain region 306. The deep well 308 may abut or be substantially aligned with an isolation region (not shown), such as field oxide or shallow trench isolation (STI) feature, that is formed on the surface of the EPI layer 304. In some cases, the deep well 308 can be made of a single surface implant that is rather shallow (e.g., adjacent to a bottom surface of the gate electrode), but in other cases the deep well 308 can be made deeper by using multiple high-energy implants (e.g., the deep well 308 can extend down to abut the buried drain region 306). The use of a single surface implant increases the lateral trench MOSFET $R_{sp}$ compared to a deep well of comparable depth. In still another embodiment, the deep well 308 can be conformal to the trench sidewalls, forming a narrow, highly doped drain plug, whereby the trench may be the gate trench, or be separate from the gate trench. The deep well 308 can also be made of discrete plugs located between trenches confining their lateral outdiffusion, for example, for smaller source drain pitch.

The gate terminal of the lateral trench MOSFET 300 includes a number of electrodes 312 that are formed in trenches extending at least partially under the surface of the drain extension layer 305. Often, the electrodes of the unit cells in a lateral trench MOSFET are tied together, for example, in configuration that is ring-like or includes a series of fingers. The electrode 312 for each unit cell includes a gate electrode region 314, which is separated from the drain extension layer 305 by a gate dielectric 316, and a field plate region 318, which is separated from the drain extension layer 305 by a field plate dielectric 320. Typically, the field plate dielectric 320 is thicker than the gate dielectric 316 to facilitate the desired functionality.

The source terminal of the lateral trench MOSFET 300 may comprise a number of shallow implant regions 322 having the first conductivity type (e.g., n-type, such as N+). Like the gate electrodes 312, these shallow implant regions 322 for the unit cells are often shorted together to act as a single source for the lateral trench MOSFET 300. For each unit cell, the shallow implant region 322 may conformally laterally abut an end face of the gate dielectric 316, and may extend at least partially under the gate dielectric's lower surface and extend at least partially around the gate dielectric's opposing sidewalls. To provide a suitable electrical contact to the shallow implant regions 322, the source terminal may also include a highly doped surface contact implant 324 having the first conductivity type (e.g., n-type, such as N++).

The body terminal of the lateral trench MOSFET 300 may comprise a number of shallow wells 326 with the second conductivity type (e.g., p-type, such as P) that are laterally spaced from the deep well 308. The shallow wells 326 may conformally surround the shallow implant regions 322, thereby separating the shallow implant regions 322 from the drain extension layer 305. Thus, during operation of the lateral trench MOSFET when $V_{GS}$ is applied, an annular channel region may be formed in the shallow wells 326 beyond of the outer surface of the gate dielectric 316. To allow access to the shallow wells 326, at least one surface contact implant 328 having the second conductivity type (e.g., p-type, such as P+) is associated with a shallow well 326.

Figure 17:
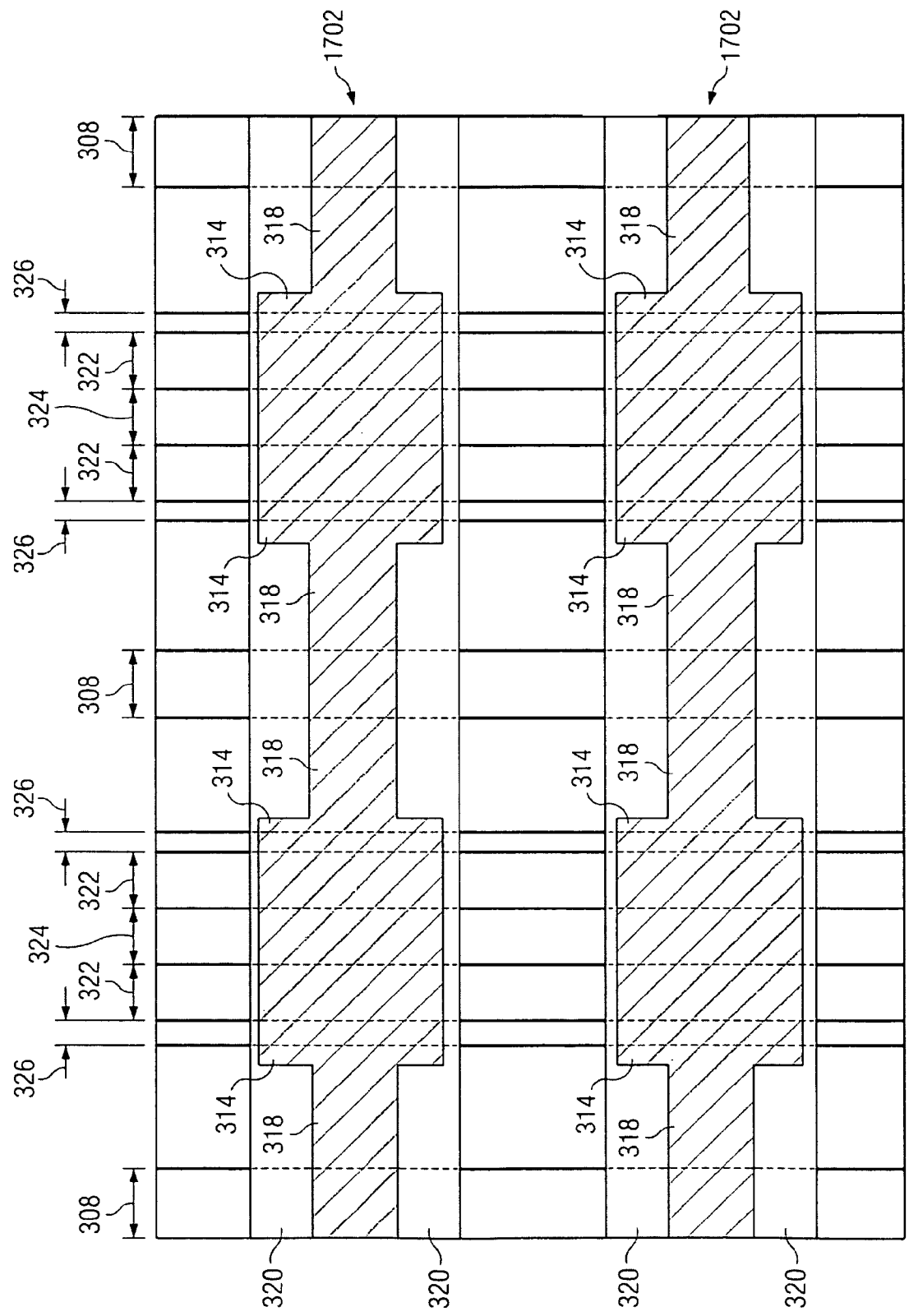
FIG. 17 shows a layout top view of another embodiment of a lateral trench MOSFET.
Figure 18:
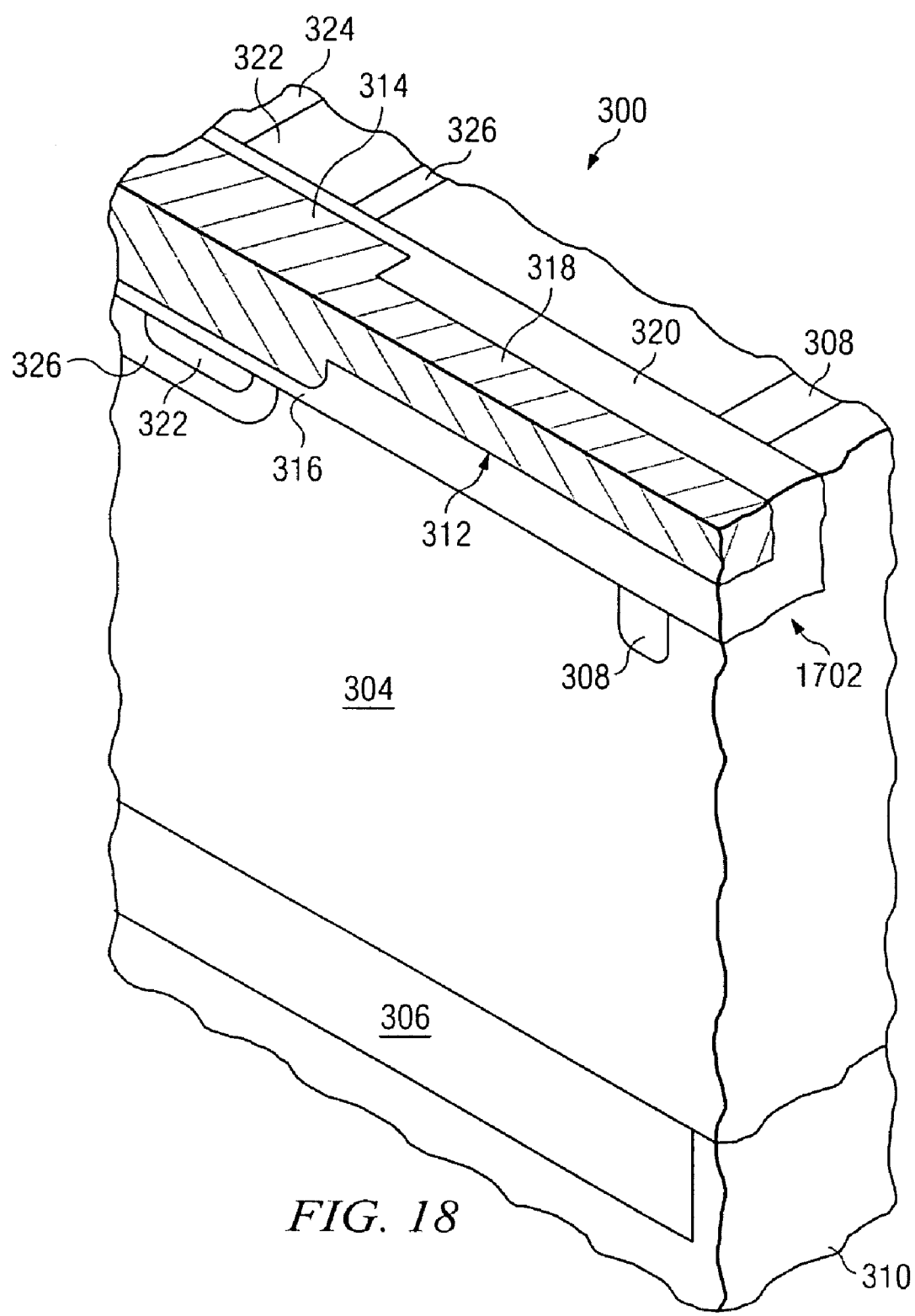
FIG. 18 shows a three-dimensional cut-away view of the lateral trench MOSFET that could be used in FIG. 17's embodiment.

FIGS. 17-18 show an embodiment where a gate trench 1702 crosses the source areas 322, body areas 326, and drain areas 308. Thus, the gate electrode 312 can extend continuously across multiple devices. In other embodiments, the trench 1702 and gate electrode 312 could stop at the source 322 or drain 308, instead of being continuous. In these designs, depending on the size of the gate trench 1702, the source and body wells on each side of the gate trench may not touch and there may be no channel under the bottom of the gate trench, the channel area being reduced to the vertical sidewalls of the trench. In spite of a potential loss of channel width under the gate trench, this design can present the advantage of a smaller $R_{sp}$ as the source-drain pitch is no longer limited by a minimum trench spacing design rule. In this example, the deep well 308 is implanted conformally to the trench and at the substrate surface between the gate trench "stripes". To limit the gain of the parasitic NPN between source, body and drain and thus improve the device Safe Operating Area, a p+ implant or diffusion conformal to the trench can also be realized aside or inside of the source in the center of the body regions.

Figure 19:
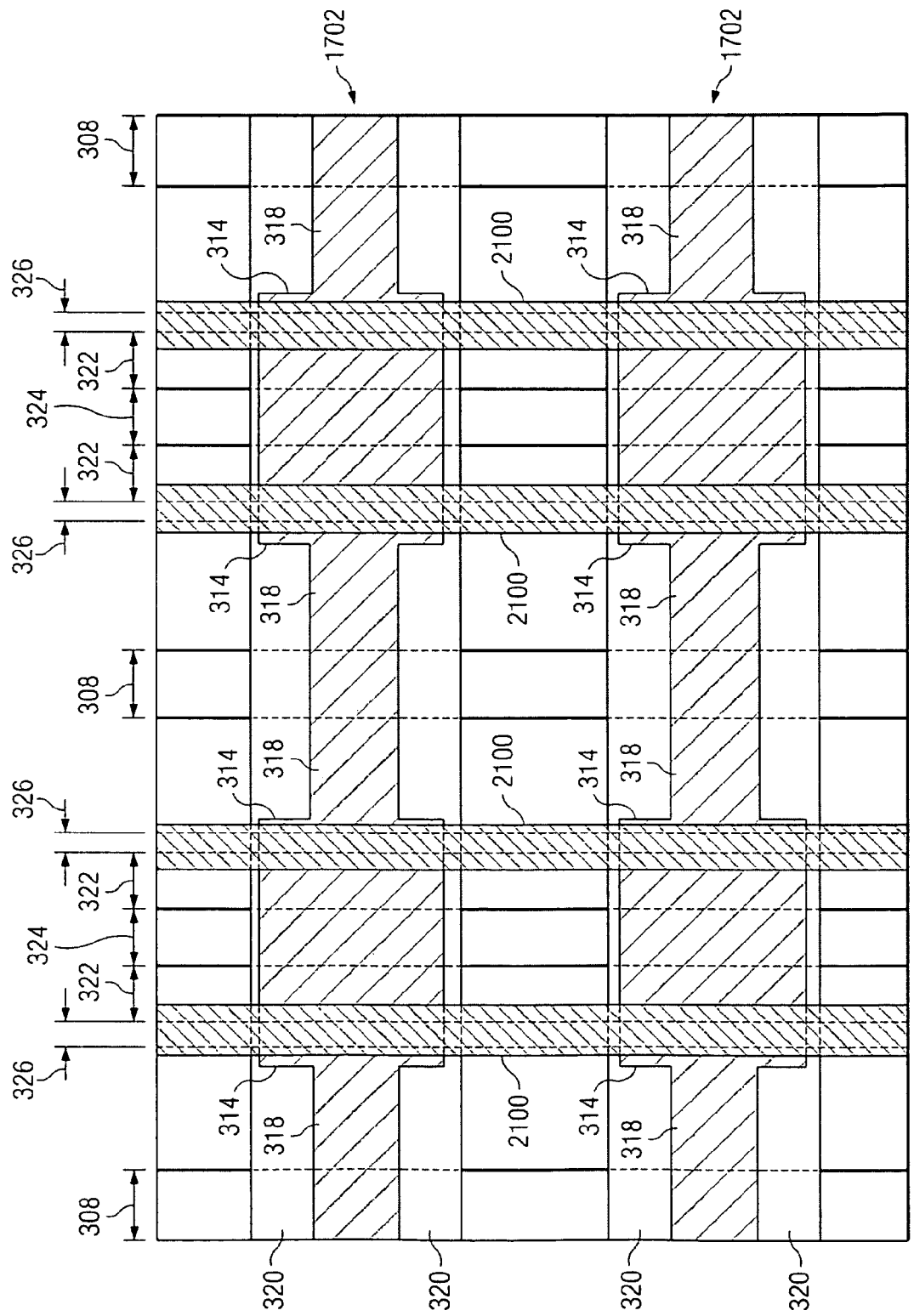
FIG. 19 shows a layout view of another embodiment of a lateral trench MOSFET that includes a gate formed over the channel region.
Figure 20:
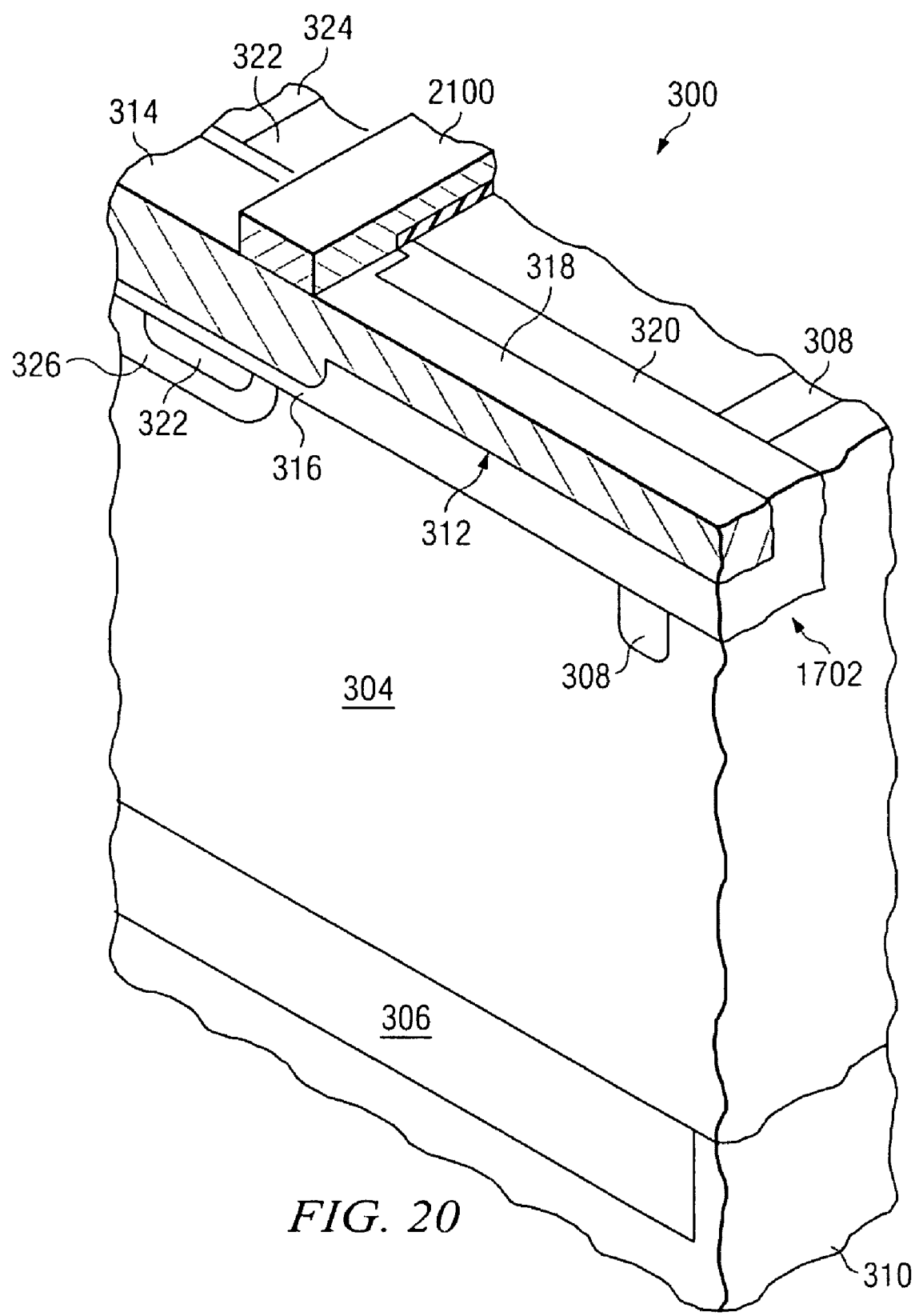
FIG. 20 shows a three-dimensional cut-away view of the lateral trench MOSFET of FIG. 19.

FIGS. 19-20 show a further embodiment in which the body and source are implanted continuously along the width of the device including the moat area between the gate trenches, and a gate electrode 2100 extends over a gate oxide and over the moat area between the gate trenches. This design brings a $3^{rd}$ channel component to the previously described vertical trench sidewall and trench bottom channels and thus further improves $R_{sp}$. The gate oxide and gate electrode 2100 can be realized within the same process steps as for the recessed trench gate by not etching back the gate electrode after deposition, or it can be realized using additional process steps after completion of the recessed trench gate process module.

Depending on the design rules for the process employed, different shape of source, drain, body, gate or field plate can be chosen to achieve desired device performance. The previous figures display only a few possible geometries of these regions, but the inventors have contemplated the use of many varying shapes in conjunction with the present invention.

Figure 5:
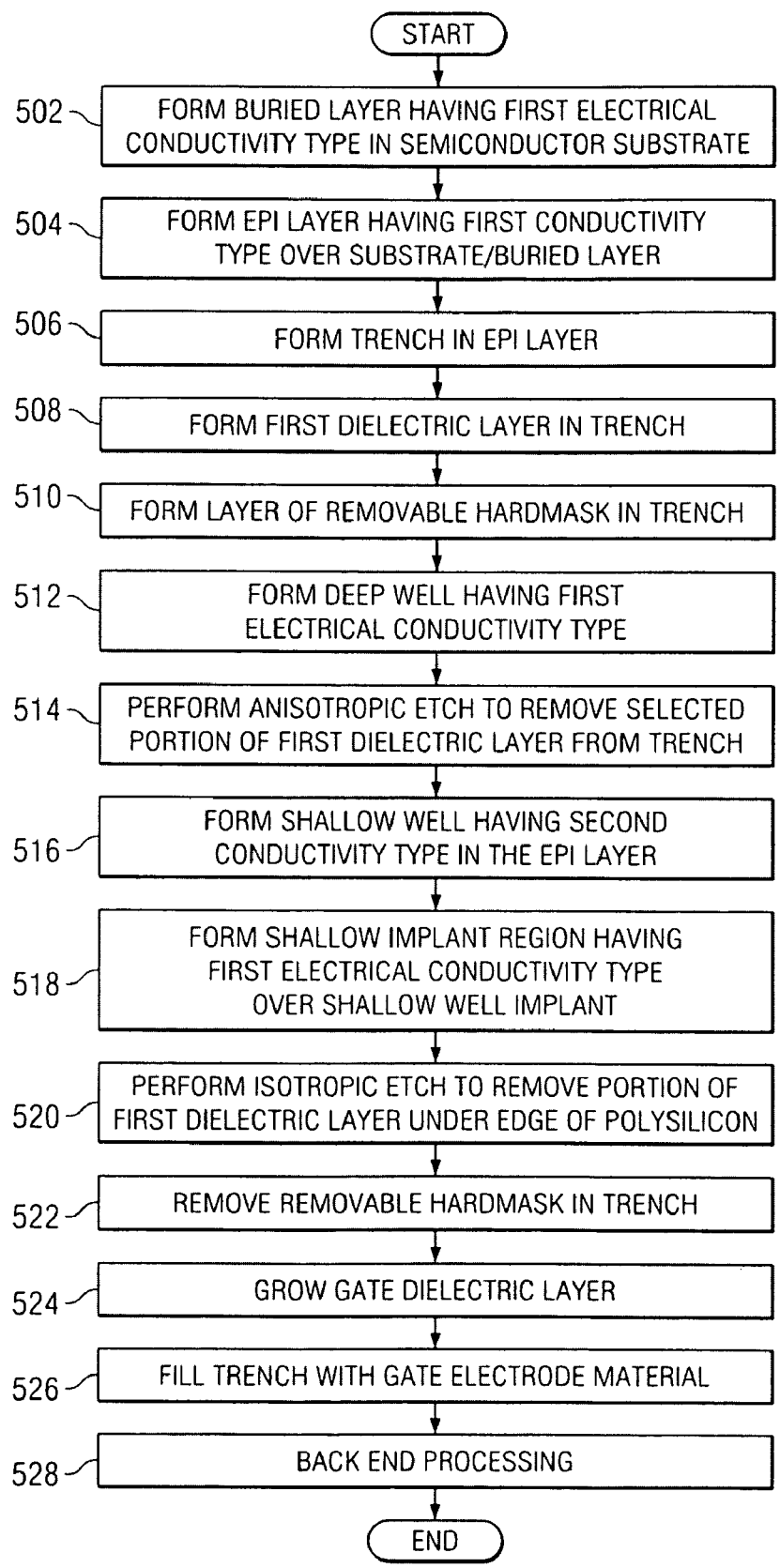
FIG. 5 is a flow diagram illustrating an exemplary methodology for fashioning a lateral trench MOSFET in accordance with one embodiment.

Now that some illustrative devices have been illustrated and described, reference is made to FIG. 5, which shows a flow diagram of an exemplary methodology 500 for forming a lateral trench MOSFET as illustrated and discussed. To show a specific example of how FIG. 5 could be implemented, FIGS. 6-17 show a series of cross sectional views of FIG. 4's lateral trench MOSFET 300 at various stages of manufacture. Although these cross-sectional views show one example of how the lateral trench MOSFET 300 could be formed, there are also ways of forming the transistor 300 that fall within the scope of the present invention. While method 500 is illustrated as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

Figure 6:
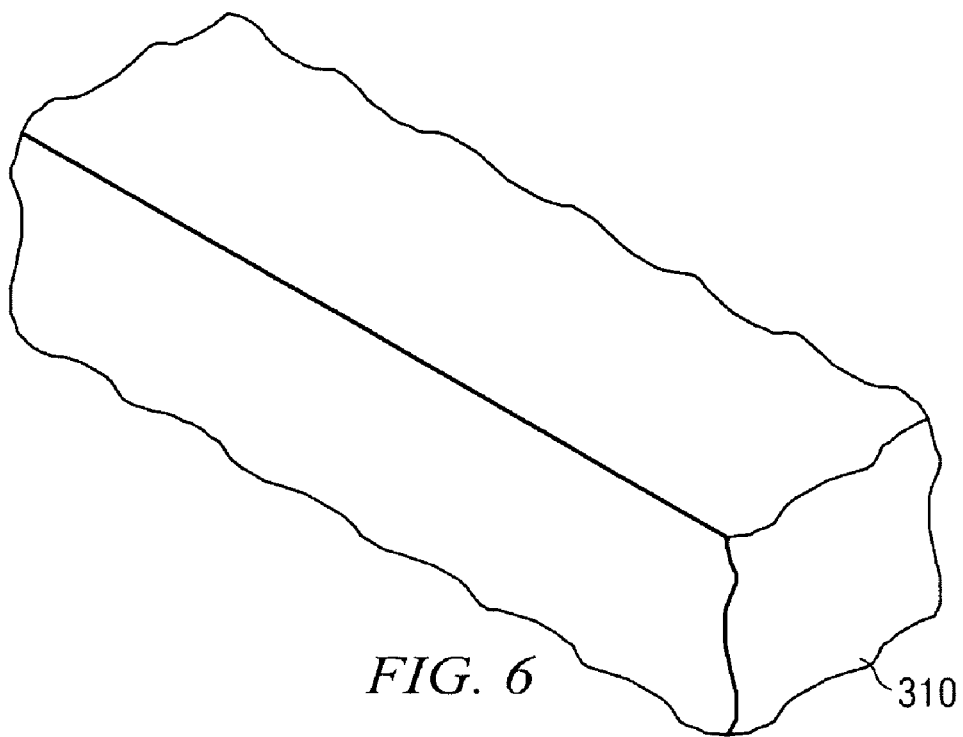
FIGS. 6-16 are three-dimensional cut-away views of a lateral trench MOSFET at various stages of manufacture, consistent with one example of FIG. 5's methodology.

Referring now to FIG. 6, the method 500 starts with a semiconductor substrate 310. It will be appreciated that substrate 310 as referred to herein may comprise any type of semiconductor body (e.g., silicon, SOI), which includes, but is not limited to: a semiconductor wafer or one or more die on a wafer, as well as any other type of semiconductor and/or epitaxial layers formed thereon and/or otherwise associated therewith. For example, a semiconductor wafer could be a silicon wafer, a semiconductor-on-insulator wafer, or any other type of semiconductor substrate.

Figure 7:
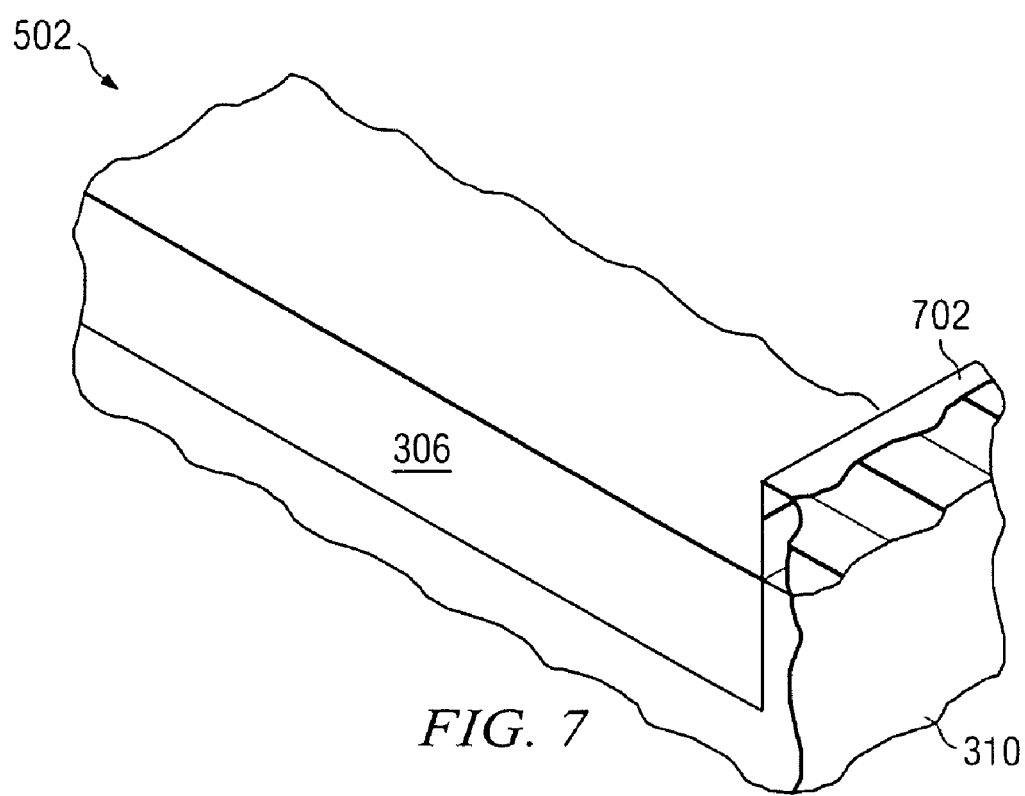

In FIG. 7 (502), a layer of photoresist 702 is patterned to expose portions of the semiconductor substrate 310. An optional buried drain region 306 having a first conductivity type (e.g., n or p type) is then formed in the semiconductor substrate 310, often by implanting an ionized n-type or p-type species into the exposed portions. The buried drain region 306 is usually heavily doped to minimize the drain resistance of the lateral trench MOSFET. In effect, the buried drain region 306 will serve to extend the drain region of the lateral trench MOSFET to extend under portions of the device. In technologies using deep trench isolation as opposed to junction isolation, the buried layer implant can be made over the entire chip (i.e., the buried layer implant can be blanket implant that is performed without a mask present).

Figure 8:
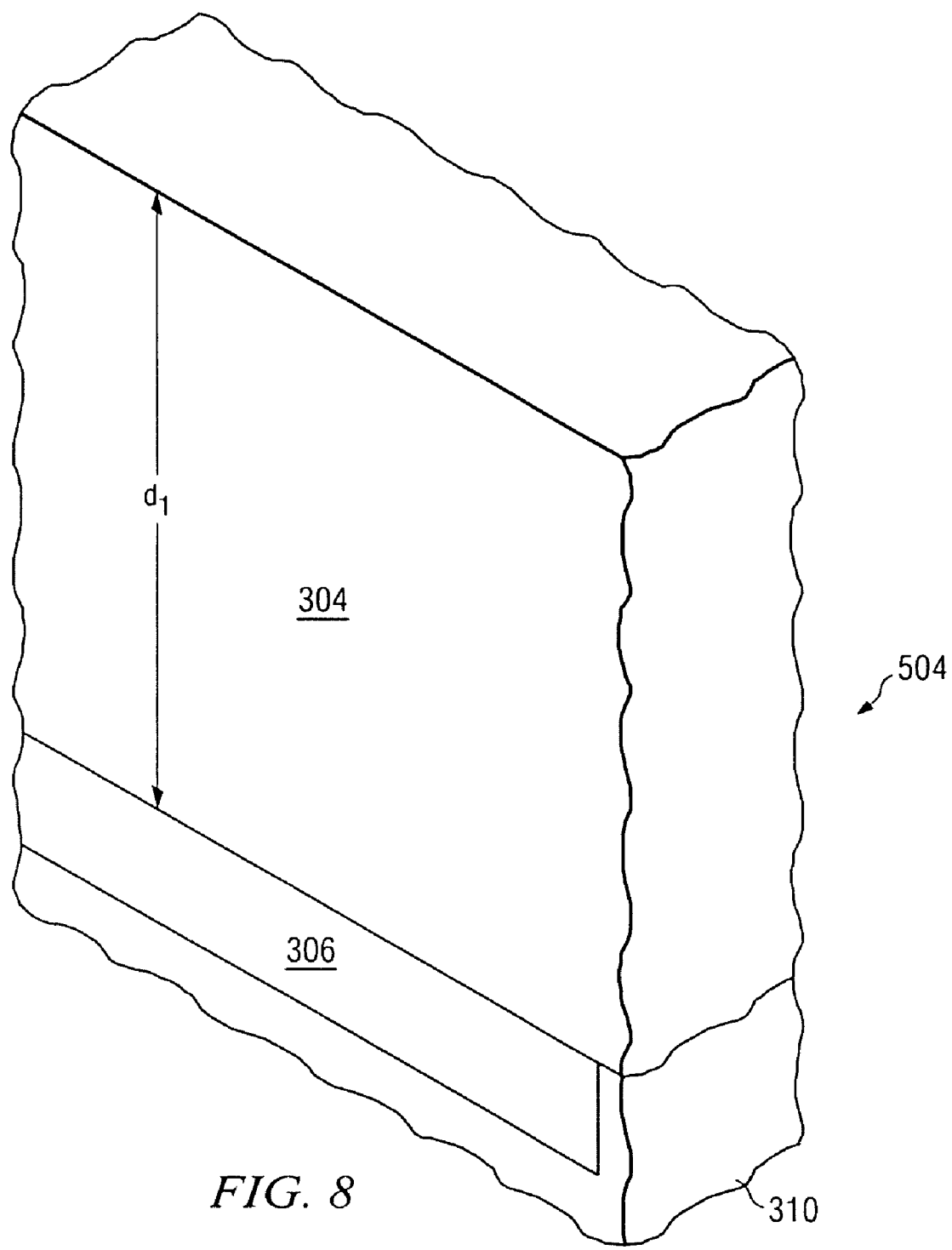

In FIG. 8 (504) an epitaxial or EPI layer 304 having the first conductivity type is formed (e.g., grown) over the surface of the substrate 310. The EPI layer 304 has a depth, $d_1$, that depends on the desired voltage rating of the lateral trench MOSFET 300, but it is typically between 2 um and 15 um in the 20-200V range. The EPI layer 304 may have the first conductivity type as formed and/or one or more dopants may be subsequently added thereto to instill the first conductivity type in the EPI layer 304. In any event, the dopant concentration of the EPI layer 304 is less than the dopant concentration of the buried drain region 306 (as well as the dopant concentration of other subsequently formed regions having the first conductivity type). Additionally, processing conditions associated with forming the EPI layer 304, such as elevated temperatures, for example, may promote some dopant diffusion.

The term epitaxial layer of as used in this disclosure is intended as a broadly reaching term and is not meant to solely comprise epitaxially grown layers. While the device of this disclosure may be built using an epitaxial layer, it does not require the use of an epitaxially grown layer. Non-epitaxially grown layers (like Silicon over Insulator layers) which are doped to have the first conductivity may comprise a layer equivalent to the epitaxial layer as referred to in this disclosure. The inventor has contemplated the use of a wide range of materials which may comprise the epitaxial layer of the disclosure.

Figure 9:
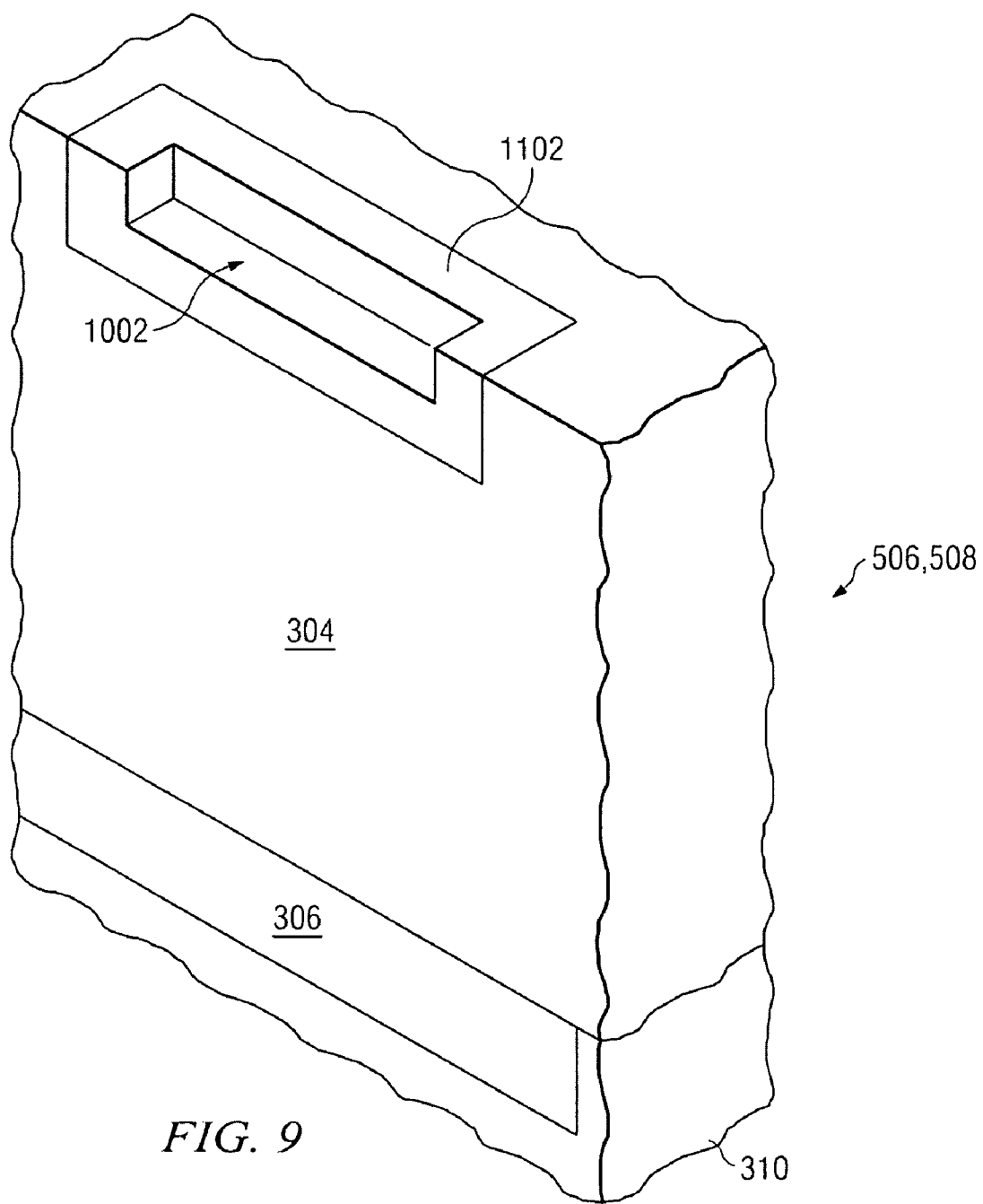

In FIG. 9 (506, 508), another mask is formed (not shown), and an etch is carried out to form a trench 1002 in the EPI layer 304. The trench 1002 bottom surface is separated from the buried layer to allow for the desired high-voltage characteristics. A thick dielectric 1102 is conformally formed on the sidewalls and bottom of the trench 1002.

Figure 10:
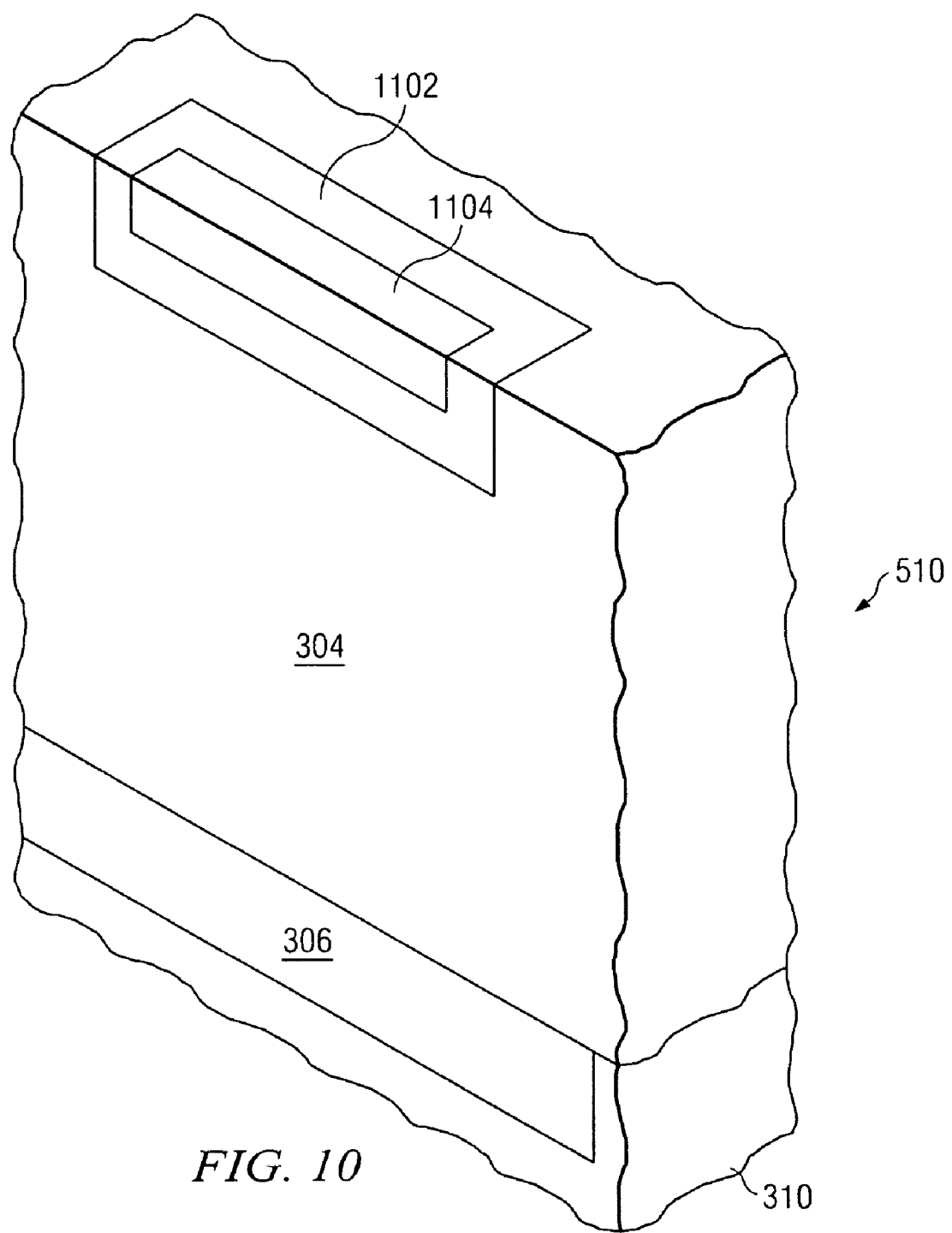

In FIG. 10 (510), a layer of removable hard mask material 1104 is conformally deposited to fill the remainder of the trench 1002. In one embodiment, the thick dielectric 1102 could be a field oxide that is formed by using a wet oxidation that is carried out for a long time period (~several hours) at a high temperature, wherein the field oxide could have a thickness of approximately 0.2-0.8 um. In other embodiments, the oxide can be deposited by CVD or other processes. Often, the layer of removable material 1104 could comprise polysilicon (or other semiconductor) based material, but could also comprise other materials.

Figure 11:
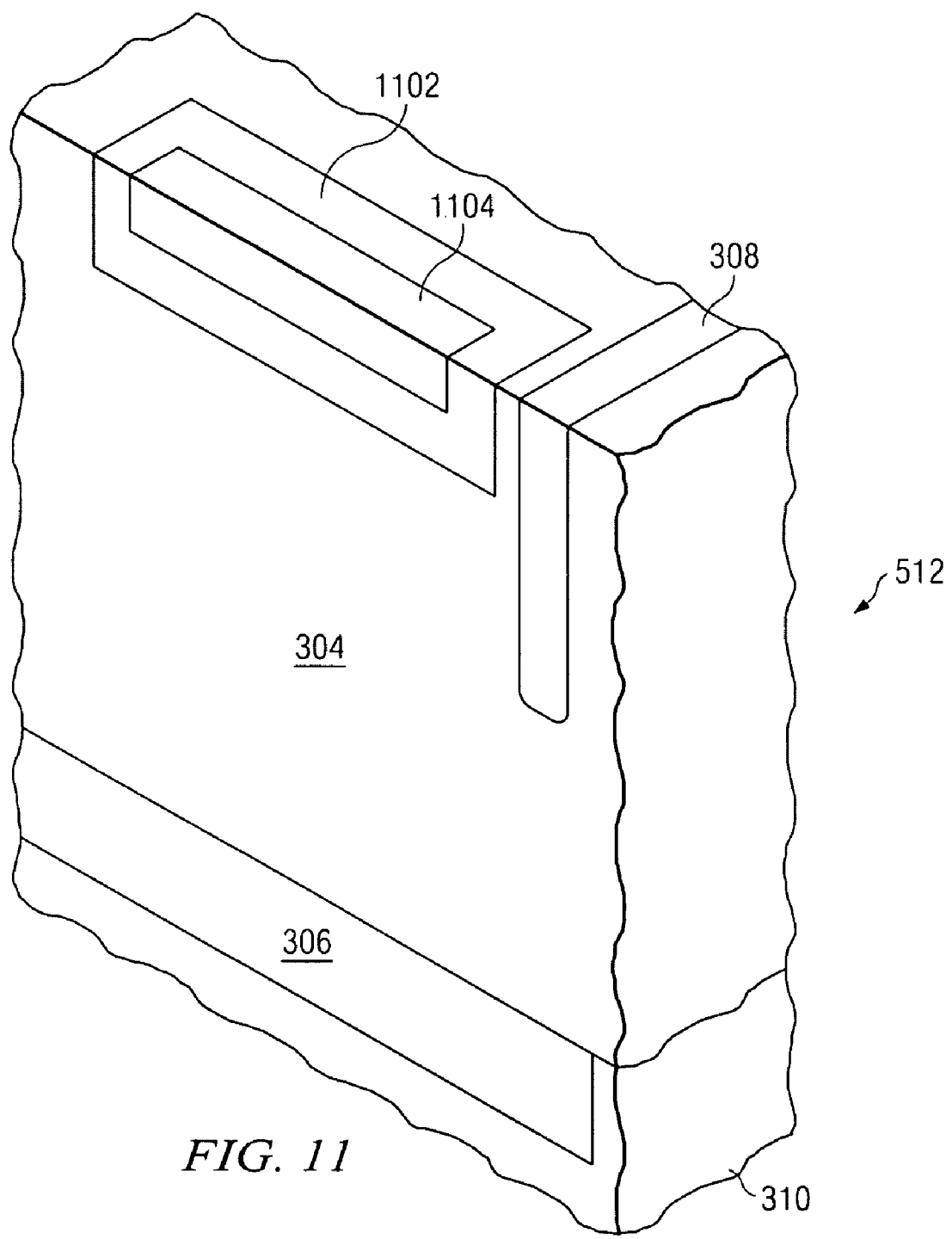

In FIG. 11 (512), another photoresist mask is formed (not shown), through which another implant is carried out to form a deep well 308, optionally followed by a dedicated diffusion step. The deep well 308 has the first conductivity type and is formed in the EPI layer 304, possibly but not necessarily down to the buried drain region 306. The deep well 308 has preferably a peak dopant concentration in the 1e17-1e19 cm-3 range, it may be low-ohmic to minimize the resistance of the up-drain terminal component. The deep well can include high-energy implants to increase its depth.

In an alternate embodiment, the deep well 308 could be formed by etching a deep trench in the EPI layer 304, by infusing the first conductivity type to the trench sidewalls and bottom by tilted implant or diffusion methods (like Phosphorus glass based) and subsequently filling the trench with some isolating, semiconductor, polysilicon or conductive material.

In a particular case, in the example of the design of FIG. 17, the trench gate can be re-used for this purpose. The thick field plate isolation can be dry etched down to the trench bottom, and the trench sidewalls can be doped using similar methods as described above (tilted implant/transfer from a highly doped layer+diffusion). Furthermore, if the doping of the body well is sufficiently lower than the doping of the deep well, the process steps described in the next paragraphs (thick trench oxide dry etch and body/source implants) can be performed without having to refill the etched trench isolation in the deep well area. This is advantageous in terms of process simplification and cost optimization.

The deep well can also be realized at different positions in the process flow, for example as a high-energy implant sequence prior to silicon trench etch or after trench gate electrode filling. Trench implants using dedicated masks (other than for the lateral MOSFET gate trench) can also be implemented prior to the silicon trench etch of the lateral trench MOSFET or after its trench gate electrode filling.

Figure 12:
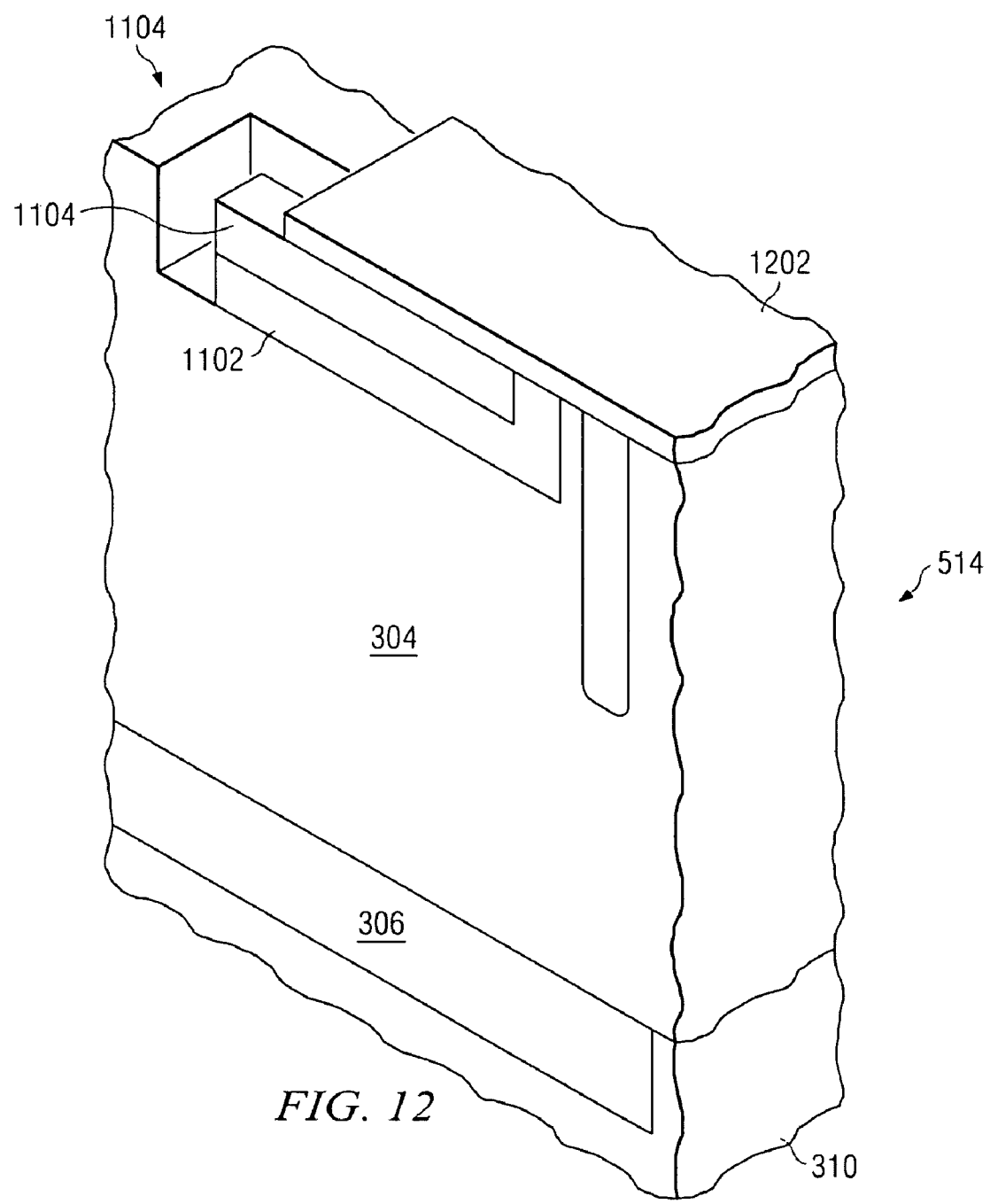

In FIG. 12 (514), another mask 1202 is formed and an anisotropic etch is carried out to remove the thick dielectric 1102 from the unmasked region 1104.

Figure 13:
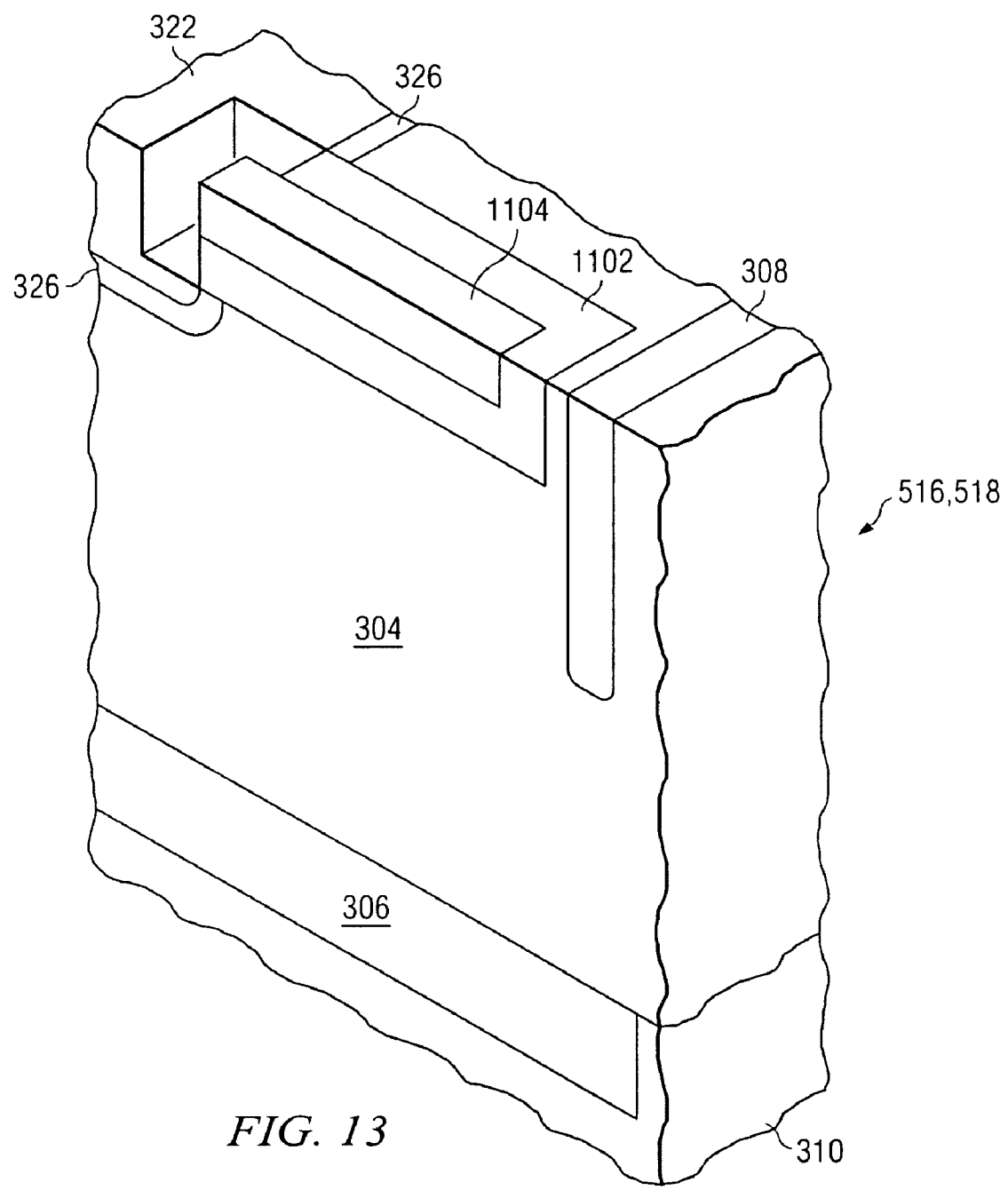

In FIG. 13 (516, 518), another photoresist mask is formed and a shallow implant region 322 and a shallow well 326 are formed. The shallow well 326 can have a peak doping concentration in the range 5e16 to 5e18 cm-3, for example. In smart power technologies, the shallow implant region 322 can constitute the source of the lateral trench MOSFET, while the shallow well 326 can constitute the body of the lateral trench MOSFET. The shallow implant region 322 and shallow well 326 can be obtained by a chain of several implants (different energy/doses/tilts etc) for the purpose of threshold, breakdown or NPN gain engineering, but can also be obtained by vapor phase deposition or other processes. In some cases the channel length of the lateral trench MOSFET results from the differential diffusion of the dopants used in shallow implant regions 322 and shallow wells 326, whereby the diffusion length of the dopant of first conductivity is smaller than the one of the dopant of second conductivity.

Figure 14:
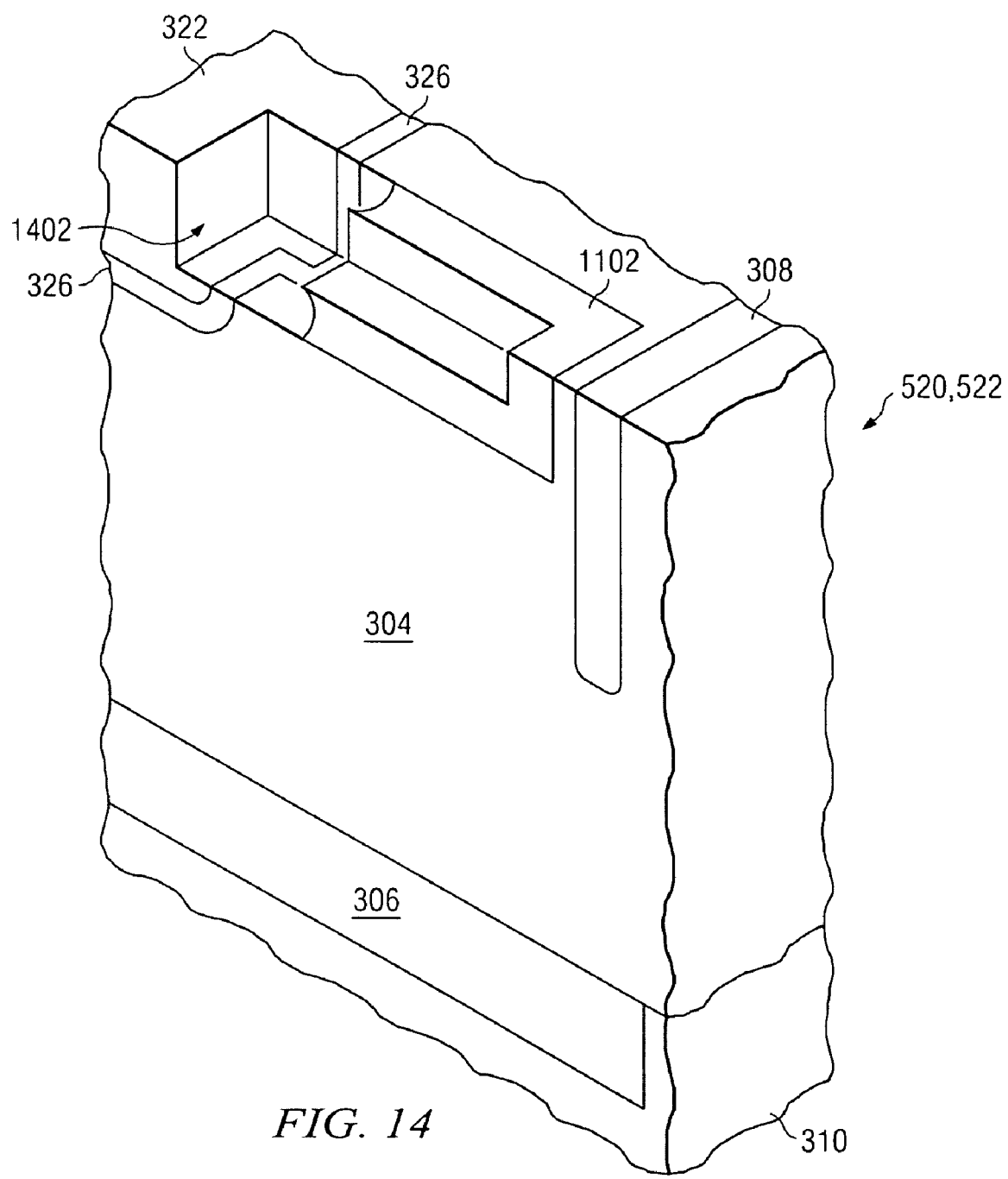

In FIG. 14 (520, 522), an isotropic etch, such as a wet etch has first been carried out to undercut the sacrificial layer 1104 (as evidenced by the beveled edges of the thick dielectric layer 1102). Next, another etch is carried out to remove the hard mask layer 1104, forming a recess 1402 as shown.

Figure 15:
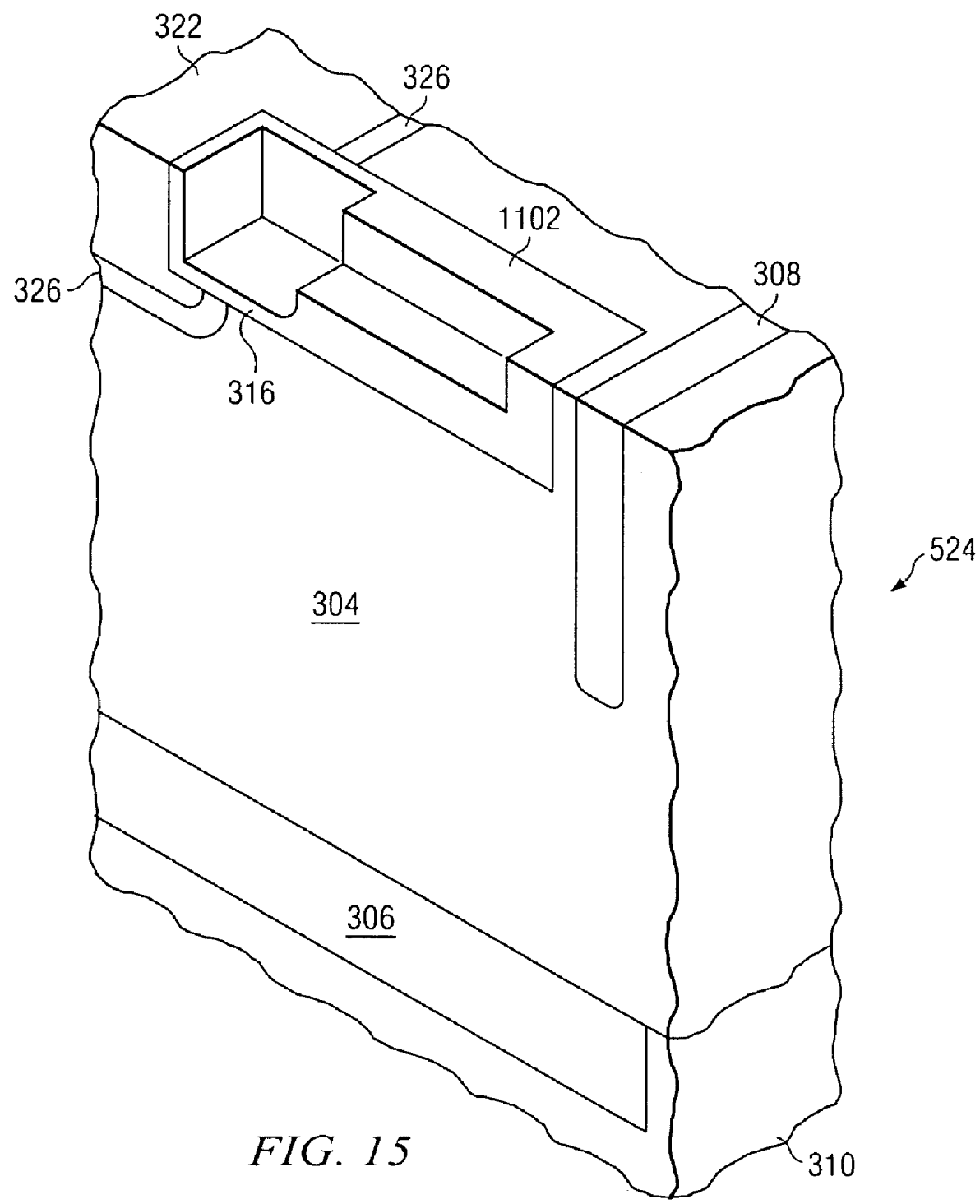

In FIG. 15 (524), a gate dielectric layer 316 is formed in the trench including the recess 1402. This gate dielectric layer 316 may add (slightly) to the thick dielectric 1102. The gate dielectric material 316 generally comprises an oxide (or other dielectric)-based material and/or a high-k material, for example, and is relatively thin, being formed to a thickness of between about 1 nm and about 50 nm, for example.

Figure 16:
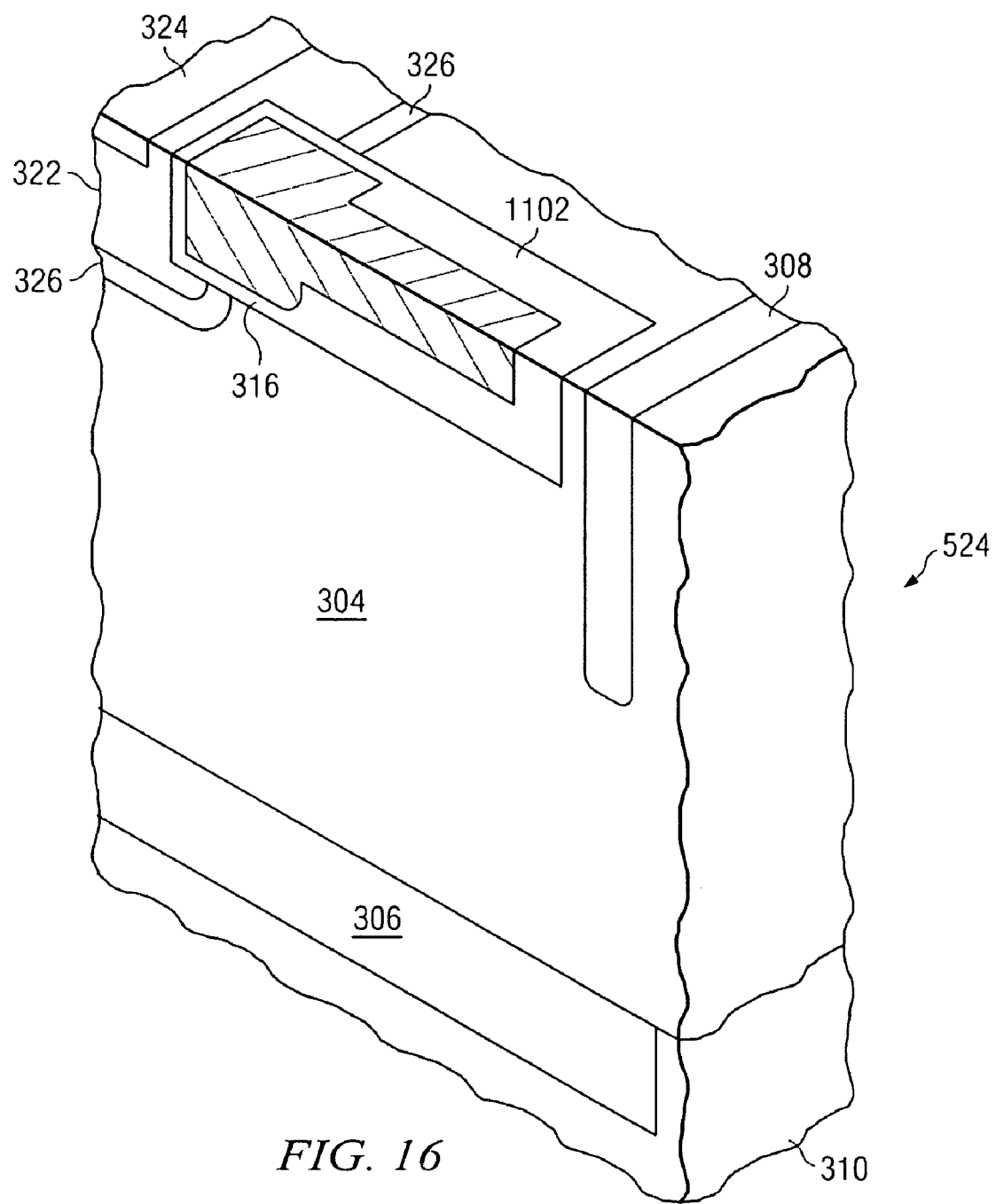

In FIG. 16, a layer of electrode material 1602, which corresponds to the electrode 312, is formed over the gate dielectric 316 and field plate dielectric 320. The layer of electrode material 1602 generally comprises a polysilicon (or other semiconductor) based material, but could also comprise a metal, for example. Thus, the layer of electrode material forms the gate electrode region and the 314 and field plate region 318. In one embodiment, the gate electrode could have a thickness of approximately 1.5 um, and extend under the surface of the EPI layer by a first vertical distance up to a few um. Further, the field plate electrode could have a thickness of approximately 0.5 um, and extend under the surface of the EPI layer by a second vertical distance that is less than the first vertical distance (i.e., the gate electrode is often "deeper" than the field plate electrode).

Although not shown, additional photoresist masks could be formed, through which additional implants could be carried out. In this manner, contacts for the source, body, and drain could be formed. The contacts are heavily doped (e.g., peak doping ~1E20 cm-3) for the purpose of providing low-ohmic contacts to the source, body, and drain.

Back end processing terminates device fabrication is performed at 528. By way of example, one or more conductive and/or dielectric layers can be formed and/or patterned during back end processing.

While reference is made throughout this document to exemplary structures in discussing aspects of methodologies described herein, those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. An integrated circuit that includes a lateral trench MOSFET, the lateral trench MOSFET comprising:

a source region having a first conductivity type and disposed in a semiconductor body;

a drain region having the first conductivity type and disposed in the semiconductor body, the drain region spaced apart from the source region;

a body region having a second conductivity type and disposed in the semiconductor body, the body region arranged between the source region and the drain region;

a gate electrode disposed in a trench in the semiconductor body, the trench disposed beneath a surface of the semiconductor body and extending at least partially laterally between the source region and the drain region;

a gate dielectric disposed in the trench and separating the gate electrode from the semiconductor body, the source region extending at least partially under a lower surface of the gate dielectric and a channel region being defined to extend at least partially below the gate dielectric;
a field plate disposed in the trench and electrically coupled to the gate electrode, the field plate laterally disposed between the drain region and the gate electrode; and
a field plate dielectric disposed in the trench and separating the field plate from the semiconductor body, the field plate dielectric being thicker than the gate dielectric.

2. The integrated circuit of claim 1, wherein the gate electrode and the field plate comprise polysilicon.

3. The integrated circuit of claim 1, wherein the gate dielectric laterally abuts an end face of the gate electrode.

4. The integrated circuit of claim 1, wherein the trench extends laterally past the source region in the semiconductor body in a direction away from the drain region.

5. The integrated circuit of claim 4, wherein the body region includes a conformal implant region having the second conductivity type that extends continuously along sidewalls of the trench.

6. The integrated circuit of claim 1, wherein the drain region comprises a vertical drain component that extends to a depth at least as deep as a depth of the trench.

7. The integrated circuit of claim 1, wherein the trench extends laterally past the drain region in a direction away from the source region, whereby the drain region is conformal to the trench.

8. The integrated circuit of claim 1, wherein the source region conformally surrounds a first region of the gate dielectric and the body region conformally surrounds a second region of the gate dielectric.

9. The integrated circuit of claim 1, wherein the source region comprises:
a shallow implant region having the first conductivity type at a first dosing concentration; and
a contact implant region having the first conductivity type at a second dosing concentration that is higher than the first dosing concentration.

10. The integrated circuit of claim 1 wherein the semiconductor body comprises:
a semiconductor substrate having the second conductivity type; and
an epitaxial (EPI) layer having the first conductivity type and disposed over the semiconductor substrate, the epitaxial layer abutting the semiconductor substrate at an interface.

11. The integrated circuit of claim 10, wherein the drain region comprises:
a buried drain region having the first conductivity type, the buried drain region horizontally disposed in the semiconductor body under the gate electrode and vertically corresponding to the interface.

12. The integrated circuit of claim 11, wherein the drain region comprises a deep well that extends downward from the surface of the semiconductor body toward the buried drain region.

13. The integrated circuit of claim 1, further comprising:
a second gate electrode extending over the surface of the semiconductor body at the body region, the second gate electrode coupled to the gate electrode and adapted to increase depletion in the body region.

14. An integrated circuit that includes a lateral trench MOSFET, the lateral trench MOSFET comprising:
an epitaxial (EPI) layer having a first conductivity type and disposed in a semiconductor body having a substrate of a second conductivity type;
a shallow implant region having the first conductivity type and disposed in the EPI layer;
a deep well region having the first conductivity type and disposed in the EPI layer, the deep well region spaced apart from the shallow implant region;
a shallow well having the second conductivity type and disposed in the EPI layer, the shallow well having at least a portion arranged laterally between the shallow implant region and the deep well region;
a gate electrode disposed in a trench in the EPI layer, the trench extending laterally at least partially between the shallow implant region and the deep well region;
a gate dielectric disposed in the trench and separating the gate electrode from the EPI layer, the shallow implant region extending at least partially under a lower surface of the gate dielectric and a channel region being defined to extend at least partially below the gate dielectric;
a field plate disposed in the trench and electrically coupled to the gate electrode, the field plate laterally disposed between the deep well region and the gate electrode.

15. The integrated circuit of claim 14, further comprising:
a field plate dielectric disposed in the trench and separating the field plate from the EPI layer, the field plate dielectric being thicker than the gate dielectric.

16. The integrated circuit of claim 14, wherein the shallow implant region abuts an end face of the gate dielectric.

17. The integrated circuit of claim 14, wherein the shallow implant region conformally laterally abuts a portion of the gate dielectric and extends at least partially around opposing sidewalls of the gate dielectric.

18. The integrated circuit of claim 14, wherein the gate dielectric laterally abuts an end face of the gate electrode.

19. The integrated circuit of claim 14, wherein the gate electrode and field plate comprise polysilicon.

20. The integrated circuit of claim 14, wherein the trench extends laterally past the deep well region in a direction away from the shallow implant region and the deep well region is conformal to sidewalls of the trench.

21. The integrated circuit of claim 14, wherein the trench extends laterally past the shallow implant region in a direction away from the deep well region and the shallow implant region is conformal to sidewalls of the trench.

* * * * *